(12) United States Patent
Nishimura et al.

(10) Patent No.: US 10,345,724 B2
(45) Date of Patent: Jul. 9, 2019

(54) POSITION CORRECTION METHOD OF STAGE MECHANISM AND CHARGED PARTICLE BEAM LITHOGRAPHY APPARATUS

(71) Applicant: NUFLARE TECHNOLOGY, INC., Kanagawa (JP)

(72) Inventors: Rieko Nishimura, Yokohama (JP); Hidekazu Takekoshi, Fujisawa (JP)

(73) Assignee: NUFLARE TECHNOLOGY, INC., Kanagawa (JP)

( * ) Notice: Subject to any disclaimer, the term of this patent is extended or adjusted under 35 U.S.C. 154(b) by 0 days.

(21) Appl. No.: 15/834,351

(22) Filed: Dec. 7, 2017

(65) Prior Publication Data

US 2018/0210353 A1 Jul. 26, 2018

(30) Foreign Application Priority Data

Jan. 26, 2017 (JP) ................................. 2017-012459

(51) Int. Cl.
*G03B 27/42* (2006.01)
*G03F 9/00* (2006.01)
(Continued)

(52) U.S. Cl.
CPC .............. *G03F 9/7049* (2013.01); *G01B 9/02* (2013.01); *G03F 1/78* (2013.01); *G03F 7/2059* (2013.01);
(Continued)

(58) Field of Classification Search
CPC .... G01B 9/02; H01J 37/3174; H01J 37/3175; G03F 1/78; G03F 9/7049; G03F 9/7092; G03F 7/2037; G03F 7/2051; G03F 7/2059; G03F 7/2061; G03F 7/2063; G03F 7/2065; G03F 7/70325; G03F 7/70375;
(Continued)

(56) References Cited

U.S. PATENT DOCUMENTS 5,003,342 A * 3/1991 Nishi .................. G03F 7/70691
355/43
5,151,749 A * 9/1992 Tanimoto ............. G01B 11/005
250/548

(Continued)

FOREIGN PATENT DOCUMENTS

EP 1014199 A2 6/2000
JP 2009-088371 A 4/2009

*Primary Examiner* — Christina A Riddle
(74) *Attorney, Agent, or Firm* — Cermak Nakajima & McGowan LLP; Tomoko Nakajima

(57) ABSTRACT

According to one aspect of the present invention, a method of correcting a position of a stage mechanism, includes generating a two-dimensional map of a distortion amount at a position of a stage by applying a distortion amount of a position in a first direction of the stage at each of measured positions in a second direction as a distortion amount of a position in the first direction of the stage at each position in the second direction at each position in the first direction and by applying a distortion amount of a position in the second direction of the stage at each of measured positions in the first direction as a distortion amount of a position in the second direction of the stage at each position in the first direction at each position in the second direction; and correcting position data by using the two-dimensional map.

21 Claims, 14 Drawing Sheets

(51) Int. Cl.
*G03F 7/20* (2006.01)
*G01B 9/02* (2006.01)
*G03F 1/78* (2012.01)
*H01J 37/317* (2006.01)

(52) U.S. Cl.
CPC ...... *G03F 7/70383* (2013.01); *G03F 7/70725* (2013.01); *G03F 7/70775* (2013.01); *H01J 37/3175* (2013.01)

(58) Field of Classification Search
CPC ............ G03F 7/70383; G03F 7/70425; G03F 7/70433; G03F 7/70483; G03F 7/70491; G03F 7/70516; G03F 7/70525; G03F 7/70533; G03F 7/7055; G03F 7/70691; G03F 7/70725; G03F 7/70775
USPC ......... 355/30, 52, 53, 55, 72–77; 250/492.1, 250/492.2, 492.21, 492.22, 492.23, 492.3, 250/493.1; 356/399–401, 496, 498, 500, 356/508–509; 430/22, 30, 311
See application file for complete search history.

(56) References Cited

U.S. PATENT DOCUMENTS

| | | | | |
|---|---|---|---|---|
| 5,363,196 | A * | 11/1994 | Cameron | G01B 11/306 356/500 |
| 5,790,253 | A * | 8/1998 | Kamiya | G03F 7/70691 356/400 |
| 6,486,955 | B1 * | 11/2002 | Nishi | G01B 11/002 356/401 |
| 6,495,847 | B1 | 12/2002 | Asano et al. | |
| 2004/0135980 | A1 * | 7/2004 | Hill | G03F 7/70591 355/52 |
| 2005/0179879 | A1 * | 8/2005 | Pril | G03F 7/70775 355/50 |
| 2007/0103659 | A1 * | 5/2007 | Yoshitake | B82Y 10/00 355/53 |

* cited by examiner

FIG.7
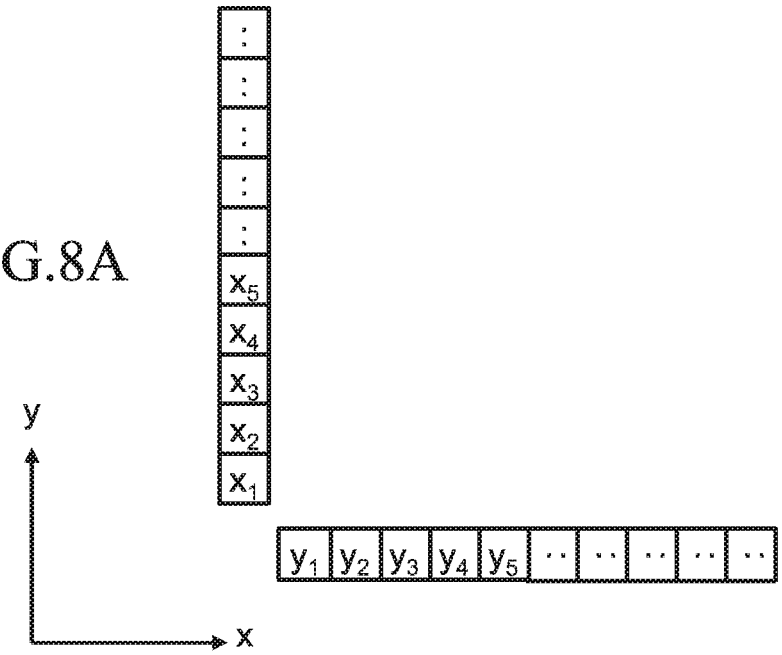
FIG.8A
FIG.8B

| Figure Code | Coordinate | Size |
|---|---|---|
| $K_1$ | $x,y$ | $L_x,L_y$ |

| Figure Code | Coordinate | Size |
|---|---|---|
| $K_1$ | $x-\Delta x_i, y-\Delta y_j$ | $L_x, L_y$ |

POSITION CORRECTION METHOD OF STAGE MECHANISM AND CHARGED PARTICLE BEAM LITHOGRAPHY APPARATUS

CROSS-REFERENCE TO RELATED APPLICATION

This application is based upon and claims the benefit of priority from prior Japanese Patent Application No. 2017-012459 filed on Jan. 26, 2017 in Japan, the entire contents of which are incorporated herein by reference.

BACKGROUND OF THE INVENTION

Field of the Invention

The present invention relates to a position correction method of a stage mechanism and a charged particle beam lithography apparatus and relates to a lithography apparatus for writing (or "drawing") a pattern on a target object, for example, by using an electron beam and a method for correcting an amount of bending deformation of a mirror of a stage in the apparatus.

Related Art

Lithography technique facilitating development of miniaturization of semiconductor devices is a very important process of generating a unique pattern in semiconductor manufacturing processes. In recent years, with high integration of LSIs, line widths of circuits required for semiconductor devices have been miniaturized year after year. In order to form a desired circuit pattern on the semiconductor devices, a highly-accurate master pattern (also called a reticle or a mask) is required. Herein, since an electron beam (EB) lithography technique has an essentially excellent resolution, the EB lithography technique is used to produce a highly-accurate master pattern.

FIG. 17 is a conceptual diagram illustrating operations of a variable-shaped electron beam lithography apparatus. A rectangular opening 411 for shaping an electron beam 330 is formed in a first aperture plate 410 of the variable-shaped electron beam lithography apparatus. In addition, a variable-shaped opening 421 for shaping the electron beam 330 passing through the opening 411 of the first aperture plate 410 into a desired rectangular shape is formed in a second aperture plate 420. The electron beam 330 irradiated from a charged particle source 430 and having passed through the opening 411 of the first aperture plate 410 is deflected by the deflector, passes through a portion of the variable-shaped opening 421 of the second aperture plate 420, and is irradiated on a target object 340 mounted on a stage which continuously moves in predetermined one direction (for example, in the X direction). Namely, a rectangular shape capable of passing through both the opening 411 of the first aperture plate 410 and the variable-shaped opening 421 of the second aperture plate 420 is written in a pattern-writing region of the target object 340 mounted on the stage continuously moving in the X direction. The method of generating an arbitrary shape by passing through both the opening 411 of the first aperture plate 410 and the variable-shaped opening 421 of the second aperture plate 420 is referred to as a variable shaping method.

Herein, the position of the above-described stage is measured by, for example, a laser interferometer. In order to measure the position with a laser interferometer, a mirror needs to be arranged on the stage that reflects a laser beam. Even in a case where there is uneven shape distortion on a mirror surface, it is difficult to grasp a distortion error of the laser interferometer. For this reason, if pattern-writing is performed by using the measurement position in the laser interferometer as it is, an error (distortion) occurs in the position to be written.

For this reason, various methods for correcting positional deviation caused by the mirror distortion have been studied in the related art (refer to, for example, Japanese Unexamined Patent Application Publication No. 2009-88371).

BRIEF SUMMARY OF THE INVENTION

According to one aspect of the present invention, a method of correcting a position of a stage mechanism, includes:

measuring a first direction position of a stage by a laser interferometry technique using a first laser beam to be irradiated to the stage for each position moved while moving the stage in a second direction perpendicular to the first direction at an interval equal to or smaller than a spot diameter of the first laser beam irradiated to the stage in a state that movement of the stage with the target object being mounted thereon in the first direction is fixed;

measuring a second direction position of the stage by the laser interferometry technique using a second laser beam to be irradiated to the stage for each position moved while moving the stage in the first direction at an interval equal to or smaller than a spot diameter of the second laser beam irradiated to the stage in a state that movement of the stage in the second direction is fixed;

calculating a distortion amount of a position in the first direction of the stage at each position in the second direction on the basis of the first direction position of the stage measured at each position in the second direction;

calculating a distortion amount of a position in the second direction of the stage at each position in the first direction on the basis of the second direction position of the stage measured at each position in the first direction;

generating a two-dimensional map of the distortion amount at the position of the stage by applying the distortion amount of the position in the first direction of the stage at each of the measured positions in the second direction as the distortion amount of the position in the first direction of the stage at each position in the second direction at each position in the first direction and by applying the distortion amount of the position in the second direction of the stage at each of the measured positions in the first direction as the distortion amount of the position in the second direction of the stage at each position in the first direction at each position in the second direction; and correcting position data indicating a position on the target object mounted on the stage by using the distortion amount defined in the two-dimensional map.

According to another aspect of the present invention, a method of correcting a position of a stage mechanism, includes:

measuring a wavelength of an uneven shape of a first plane of a stage extending in a first direction and being irradiated with a laser beam for measuring a position of the stage with a target object being mounted thereon by a laser interferometry technique and a wavelength of an uneven shape of a second plane of the stage extending in a second direction perpendicular to the first direction;

adjusting a light flux diameter of the laser beam so that a spot diameter of the laser beam is equal to or larger than at least one of the wavelength of the uneven shape of the first plane measured and the wavelength of the uneven shape of the second plane measured; and measuring the position of the stage by the laser interferometry technique using the laser beam with a light flux diameter being adjusted so that the spot diameter is equal to or larger than the at least one of the wavelength of the uneven shape of the first plane measured and the wavelength of the uneven shape of the second plane measured.

According to yet another aspect of the present invention, a charged particle beam lithography apparatus includes:

a first laser length measurement device configured to measure a first direction position of a stage by a laser interferometry technique using a laser beam to be irradiated to the stage for each position moved while moving the stage in a second direction perpendicular to the first direction at an interval equal to or smaller than a spot diameter of the first laser beam irradiated to the stage in a state that movement of the stage with the target object being mounted thereon in the first direction is fixed;

a second laser length measurement device configured to measure a second direction position of the stage by the laser interferometry technique using the laser beam to be irradiated to the stage for each position moved while moving the stage in the first direction at an interval equal to or smaller than a spot diameter of the second laser beam irradiated to the stage in a state that movement of the stage in the second direction is fixed;

a first distortion amount calculation processing circuit configured to calculate a distortion amount of a position in the first direction of the stage at each position in the second direction on the basis of the first direction position of the stage measured at each position in the second direction;

a second distortion amount calculation processing circuit configured to calculate a distortion amount of a position in the second direction of the stage at each position in the first direction on the basis of the second direction position of the stage measured at each position in the first direction;

a two-dimensional map generation processing circuit configured to generate a two-dimensional map of the distortion amount at the position of the stage by applying the distortion amount of the position in the first direction of the stage at each of the measured positions in the second direction as the distortion amount of the position in the first direction of the stage at each position in the second direction at each position in the first direction and by applying the distortion amount of the position in the second direction of the stage at each of the measured positions in the first direction as the distortion amount of the position in the second direction of the stage at each position in the first direction at each position in the second direction;

a correction processing circuit configured to correct position data indicating a position on the target object mounted on the stage by using the distortion amount defined in the two-dimensional map; and a pattern-writing mechanism including the movable stage with the target object being mounted thereon, an emission source emitting a charged particle beam, and a deflector deflecting the charged particle beam configured to write a pattern on the target object on the basis of the corrected position data by using the charged particle beam.

BRIEF DESCRIPTION OF THE DRAWINGS

FIG. 7 is a diagram illustrating an example of measurement intervals in the first embodiment;

FIGS. 8A and 8B are diagrams illustrating measurement results in the first embodiment;

DETAILED DESCRIPTION OF THE INVENTION

In a stage mechanism in the related art, since the size of a laser irradiation space had more margin than the present time, a laser beam having a large spot diameter equal to or larger than a wavelength of minute distortion of a mirror may be irradiated without consideration. For this reason, the error caused by the minute distortion of the mirror is averaged within the spot diameter, and thus, it has been possible to secure an allowable pattern-writing position by a correction method in the related art.

However, in terms of a device installation area, miniaturization of a device configuration has become mainstream. For this reason, by decreasing the spot diameter of the laser beam being irradiated on the mirror, the system configuration of a laser interferometer is miniaturized, aiming at miniaturization of a whole device configuration. Along with the miniaturization, errors of the stage position measured by the laser interferometer caused by the minute distortion hidden by the averaging effect in the related art have become remarkable. For this reason, a more accurate correction method is desired to be established.

Hereinafter, in the embodiment, a method capable of correcting the position of a stage mechanism with respect to the minute distortion of a mirror of the stage mechanism and a lithography apparatus capable of executing such a method will be described.

In addition, hereinafter, in the embodiment, a configuration using an electron beam as an example of a charged particle beam will be described. However, the charged particle beam is not limited to the electron beam, but any beam using other charged particles such as an ion beam or the like may be employed. In addition, in the embodiment, as an example, a lithography apparatus using a single beam will be described, but the present invention is not limited thereto. A lithography apparatus using multiple beams may be employed.

First Embodiment

Figure 1:
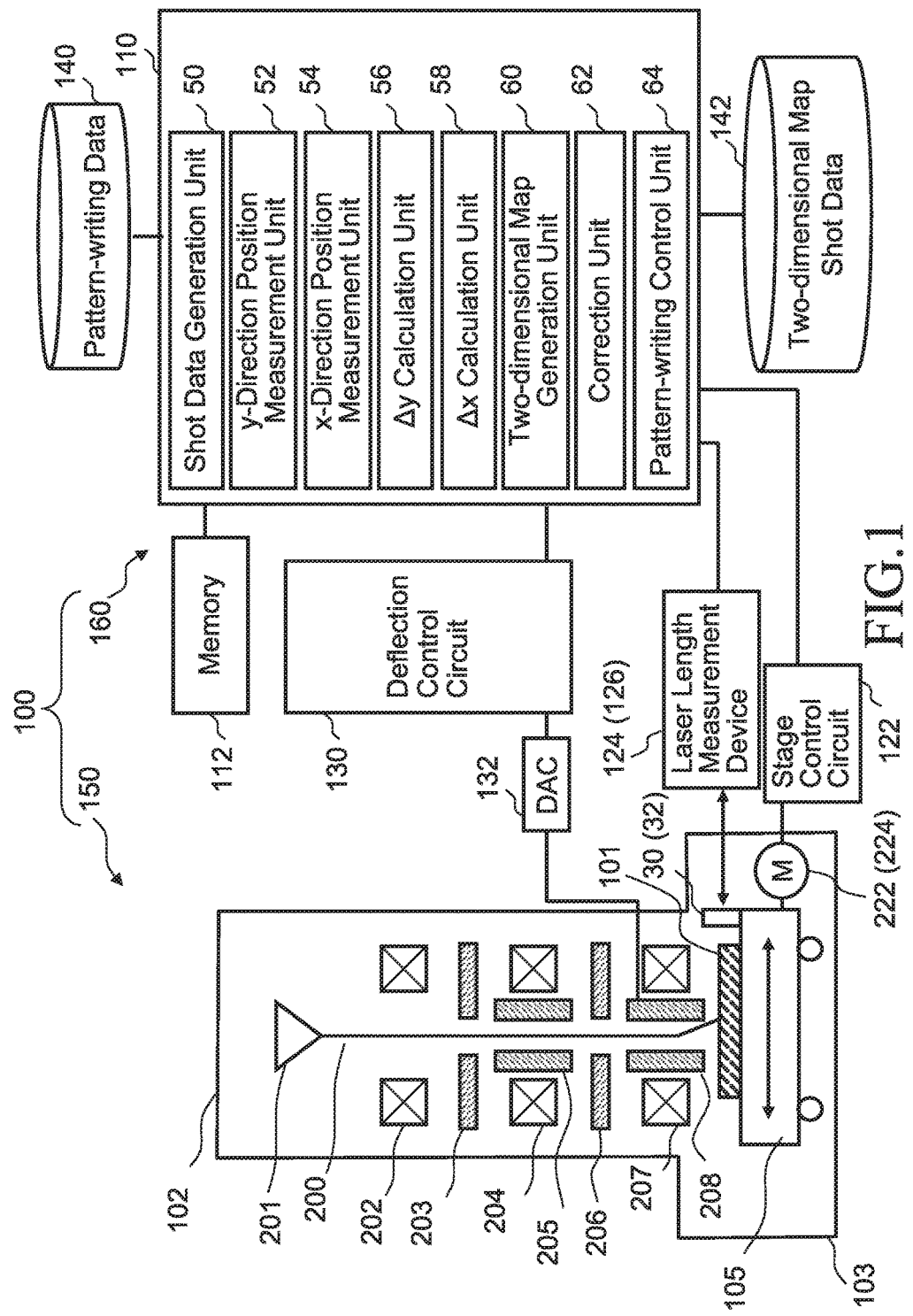
FIG. 1 is a conceptual diagram illustrating a configuration of a lithography apparatus according to a first embodiment.

FIG. 1 is a conceptual diagram illustrating a configuration of a lithography apparatus according to a first embodiment. In FIG. 1, a lithography apparatus 100 is an example of a charged particle beam lithography apparatus. The lithography apparatus 100 is configured to include a pattern-writing (or "pattern-drawing") mechanism 150 and a control system circuit 160. The pattern-writing mechanism 150 is provided with a lithography chamber 103 and an electron lens barrel (electron beam column) 102 arranged above the lithography chamber 103. In the electron lens barrel 102, an electron gun assembly 201, an illumination lens 202, a first aperture plate 203, a projection lens 204, a deflector 205, a second aperture plate 206, an objective lens 207, and a deflector 208 are provided. In addition, an XY stage 105 and motors 222 and 224 for driving the XY stage 105 are arranged in the lithography chamber 103. A target object 101 on which pattern-writing is to be performed and reflecting mirrors 30 and 32 used for a length measurement system utilizing laser interference are arranged on the XY stage 105. As the target object 101, for example, a wafer on which a semiconductor device is formed and a mask for exposure for transferring a pattern onto the wafer are included. In addition, the mask includes, for example, a mask blank in which no pattern is formed yet.

The control system circuit 160 is configured to include a control computer 110, a memory 112, a stage control circuit 122, laser length measurement devices 124 and 126, a deflection control circuit 130, and a digital/analog conversion (DAC) amplifier 132. The control computer 110, the memory 112, the stage control circuit 122, the laser length measurement devices 124 and 126, and the deflection control circuit 130 are connected to each other via a bus (not shown). The DAC amplifier 132 is connected to the deflection control circuit 130. The motors 222 and 224 are connected to the stage control circuit 122. The pattern-writing data is input from the outside of the lithography apparatus 100 and stored in the storage device 140.

A shot data generation unit 50, a y-direction position measurement unit 52, an x-direction position measurement unit 54, a y-direction distortion $\Delta y$ calculation unit 56, an x-direction distortion $\Delta x$ calculation unit 58, a two-dimensional map generation unit 60, a correction unit 62, and a pattern-writing control unit 64 are arranged in the control computer 110. Each of the " . . . units" such as the shot data generation unit 50, the y-direction position measurement unit 52, the x-direction position measurement unit 54, the y-direction distortion $\Delta y$ calculation unit 56, the x-direction distortion $\Delta x$ calculation unit 58, the two-dimensional map generation unit 60, the correction unit 62, and the pattern-writing control unit 64 includes a processing circuitry. As the processing circuitry, for example, an electric circuit, computer, processor, circuit board, quantum circuit, or semiconductor device can be used. Each " . . . unit" may use a common processing circuitry (same processing circuitry), or different processing circuitries (separate processing circuitries). The input data necessary for or the calculation results of the shot data generation unit 50, the y-direction position measurement unit 52, the x-direction position measurement unit 54, the y-direction distortion $\Delta y$ calculation unit 56, the x-direction distortion $\Delta x$ calculation unit 58, the two-dimensional map generation unit 60, the correction unit 62, and the pattern-writing control unit 64 are stored in the memory 112 each time.

In FIG. 1, descriptions of the components other than those necessary for explaining the first embodiment are omitted. In general, the lithography apparatus 100 may include other necessary structures.

Figure 2:
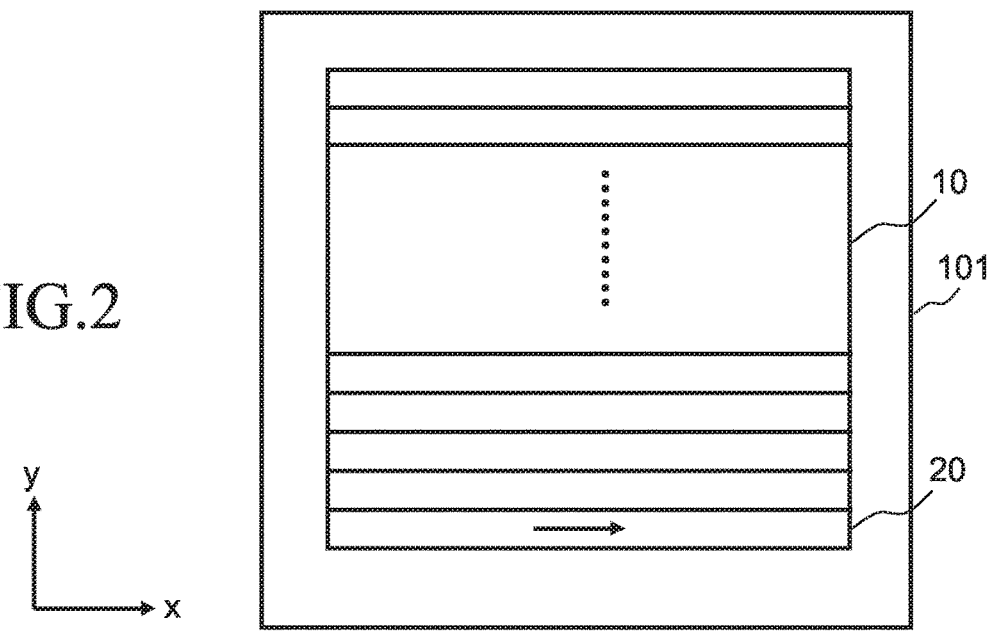
FIG. 2 is a conceptual diagram illustrating each region in the first embodiment.

FIG. 2 is a conceptual diagram illustrating each region in the first embodiment. In FIG. 2, a pattern-writing region 10 of the target object 101 is virtually divided into a plurality of strip-shaped stripe regions 20 having a strip shape, for example, in the y direction, for example, with a y-direction deflectable width of the deflector 208 or a slightly smaller width. The pattern-writing process for the target object 101 is executed in units of the stripe region 20, for example, by performing the pattern-writing process in the x direction.

Figure 3:
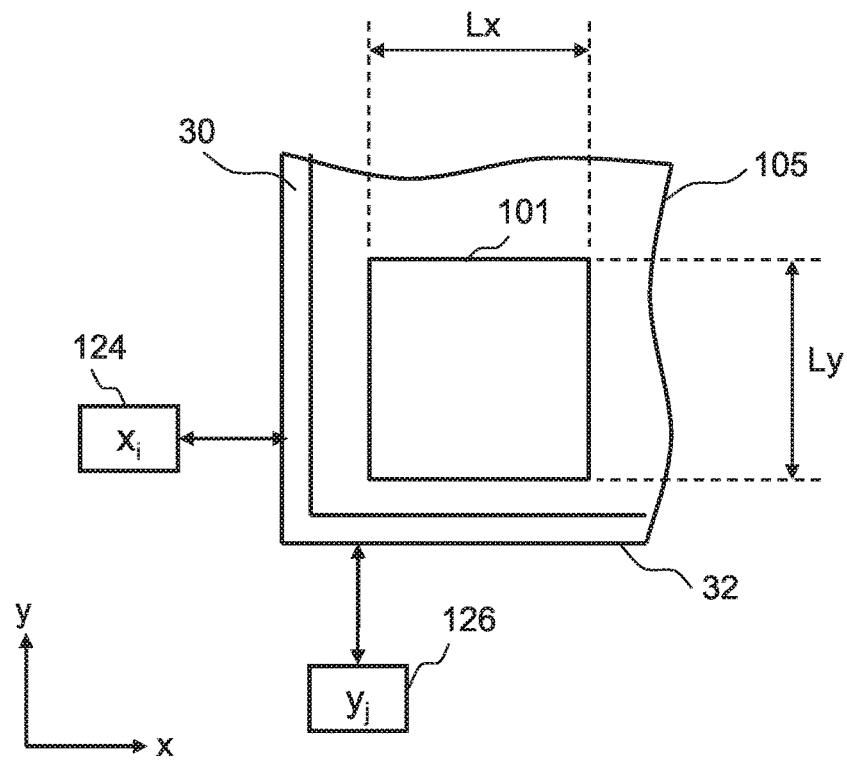
FIG. 3 is a conceptual diagram illustrating measurement positions of a laser length measurement device in the first embodiment.

FIG. 3 is a conceptual diagram illustrating measurement positions of the laser length measurement device in the first embodiment. In FIG. 3, reflecting mirrors 30 and 32 are arranged along two sides perpendicular to the XY stage 105. Herein, the reflecting mirror 30 (the first mirror) is arranged so that the reflecting plane is positioned in the x direction (the first direction), and the reflecting mirror 32 (the second mirror) is arranged so that the reflecting plane is positioned in the y direction (the second direction). In addition, the laser length measurement device 124 is arranged so as to irradiate the laser beam on the reflecting mirror 30 so that the reflecting plane is positioned in the x direction. The laser length measurement device 126 is arranged so as to irradiate the laser beam on the reflecting mirror 32 so that the reflecting plane is positioned in the y direction. The motor 222 moves the XY stage 105 in the x direction, and the motor 224 moves the XY stage 105 in the y direction.

Figure 4:
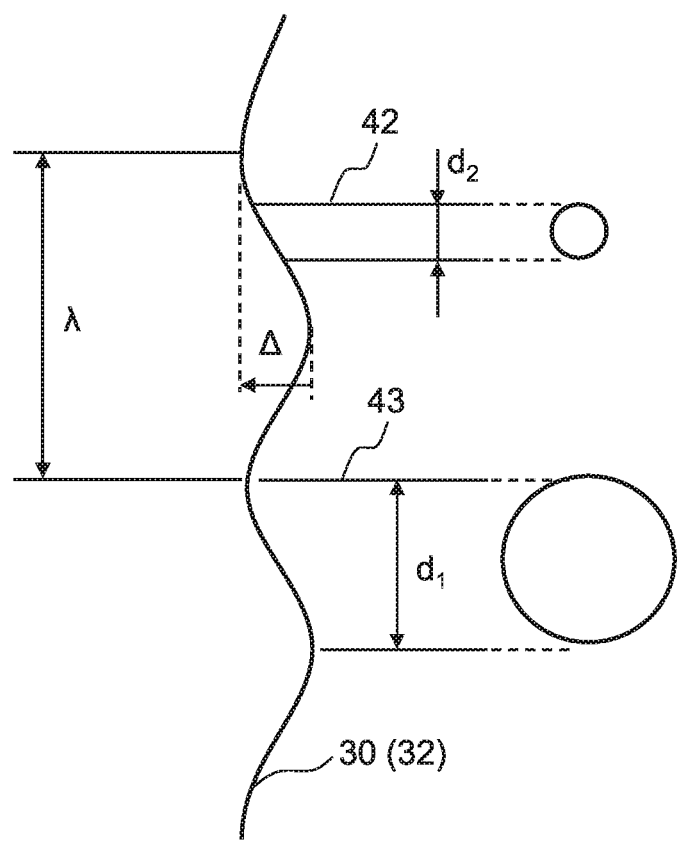
FIG. 4 is a conceptual diagram illustrating an example of a state of bending deformation occurring in the reflecting mirror in the first embodiment and an example of the relationship between the bending deformation and the laser spot diameter.

FIG. 4 is a conceptual diagram illustrating an example of a state of bending deformation occurring in the reflecting mirror in the first embodiment and an example of the relationship between the bending deformation and the laser spot diameter. The reflecting mirrors 30 and 32 are manufactured so the distortion (uneven shape) having a wavelength of several mm order (for example, 5 mm) or more is not generated on the reflecting plane as the processing accuracy from the improvement of the processing technique. However, it is still difficult to process the reflecting plane into a perfect plane. In addition, if the processing accuracy is further improved, the manufacturing cost will be greatly increased. Alternatively, in a case where the distortion (uneven shape) having a wavelength of several mm order (for example, 5 mm) or more occurs on the reflecting plane, the stage position correction method in the related art may be used to cope with the case. In the first embodiment, in a case where the spot diameter d of the beam becomes smaller than the wavelength $\lambda$ of the distortion, the error caused by the distortion (uneven shape) is corrected. In particular, it is effective in the case of correcting an error caused by distortion (uneven shape) having a wavelength of less than several mm order (for example, 5 mm).

Herein, with respect to the wavelength $\lambda$ of the distortion (uneven shape) of the reflecting plane (stage position measuring plane) of the reflecting mirror 30 (32), in a case where the laser beam 43 is emitted from the laser length measurement device 124 (126) to the reflecting mirror 30 (32), if the spot diameter d1 of the beam is equal to or larger than the wavelength λ of the distortion, since the maximum value and the minimum value of the amplitude Δ of the distortion are included within the spot diameter d1, the measurement error of the position of the XY stage 105 caused by the distortion can be suppressed to a negligible level due to the averaging effect. In the related art, a spot diameter of, for example, about 10 mm or slightly smaller is mainly used. As illustrated in FIG. 4, if the spot diameter d1 has a size of at least equal to or larger than ½ of the wavelength λ of the distortion, the maximum value and the minimum value of the amplitude Δ of the distortion can be included within the spot diameter d1, so that the averaging effect can be expected. However, since the miniaturization of the device configuration has become mainstream in terms of the installation area of the lithography apparatus 100 as described above, by reducing the spot diameter of the laser beam being irradiated on the reflecting mirror 30 (32), the miniaturization of the system configuration of the laser length measurement device 124 (126) is aimed at miniaturizing the whole device configuration. Accordingly, as illustrated in FIG. 4, in a case where the laser beam 42 is irradiated on the reflecting mirror 30 (32) from the laser length measurement device 124 (126), if the spot diameter d2 of the beam is smaller than ½ of the wavelength λ of the distortion, the error of the position of the XY stage 105 measured by the laser length measurement device 124 (126) has become remarkable due to the minute distortion hidden by the averaging effect so far. For this reason, an error occurs in the beam deflection position.

Figure 5:
FIG. 5 is a diagram illustrating an example of the positional deviation amount of an evaluation pattern formed on a substrate in the first embodiment.

FIG. 5 is a diagram illustrating an example of a positional deviation amount of an evaluation pattern formed on a substrate in the first embodiment. In FIG. 5, the positional deviation amount from the design position in the y direction of the evaluation pattern written (or "drawn") on the vertical axis, and the position in the x direction of the evaluation pattern written on the horizontal axis are illustrated. In addition, in FIG. 5, in a case where a line pattern linearly extending in the x direction as the evaluation pattern is written on the substrate coated with a resist on the light-shielding film by the lithography apparatus 100, and a portion of the positions of the pattern obtained by performing developing, ashing, and etching is measured by a position measurement device, the measurement results is illustrated. As illustrated in FIG. 5, it can be understood that, although the noise component is included in the measurement result, the distortion having an amplitude in the y direction occurs as an overall tendency. The distortion can also occur similarly in the y direction position of the evaluation pattern.

Therefore, in the first embodiment, the measurement error of the stage position that occurs in a case where the spot diameter of the laser beam irradiated from the laser length measurement device 124 (126) on the reflecting mirror 30 (32) becomes small is corrected.

Figure 6:
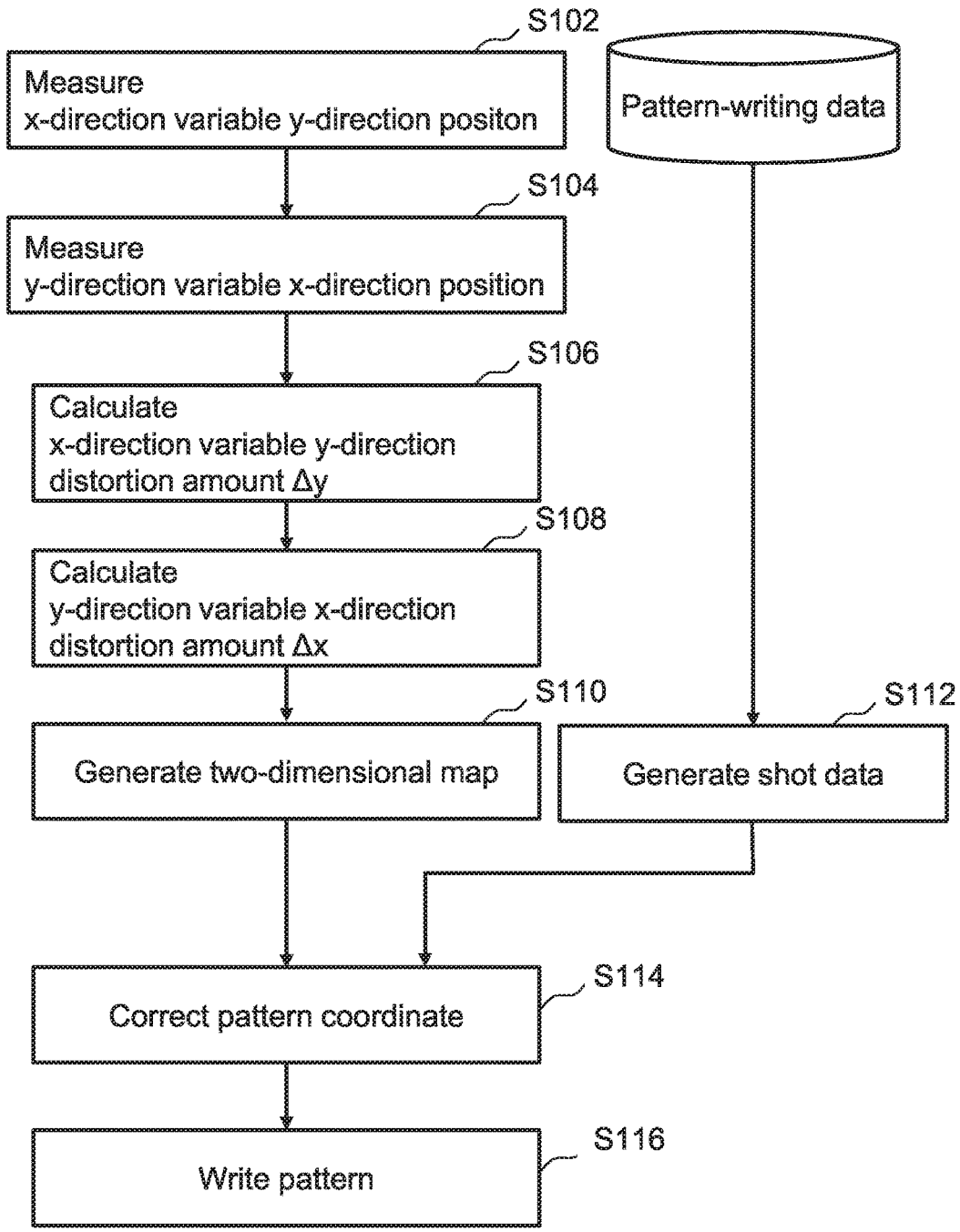
FIG. 6 is a flowchart illustrating main steps of the lithography method according to the first embodiment.

FIG. 6 is a flowchart illustrating main steps of a lithography method according to the first embodiment. In FIG. 6, in the lithography method according to the first embodiment, a series of steps of an x-direction variable y-direction position measurement step (S102), a y-direction variable x-direction position measurement step (S104), an x-direction variable y-direction distortion amount Δy calculation step (S106), a y-direction variable x-direction distortion amount Δx calculation step (S108), a two-dimensional map generation step (S110), a shot data generation step (S112), a pattern coordinate correction step (S114), and a pattern-writing step (S116) are performed. Among such series of steps, the x-direction variable y-direction position measurement step (S102), the y-direction variable x-direction position measurement step (S104), the x-direction variable y-direction distortion amount Δy calculation step (S106), the y-direction variable x-direction distortion amount Δx calculation step (S108), the two-dimensional map generation step (S110), and the pattern coordinate correction step (S114) correspond to the position correction method of the stage mechanism.

As the x-direction variable y-direction position measurement step (S102), in a state that the movement of the XY stage 105 in the y direction (the first direction) is fixed, while moving the XY stage 105 in the x direction (second direction) at an interval equal to or smaller than the spot diameter of the laser beam irradiated on the XY stage 105, the laser length measurement device 126 (the first laser length measurement device) measures the y-direction position of the XY stage 105 for each position moved by the laser interferometry technique using the laser beam. Specifically, under the control of the stage control circuit 122, the rotation axis of the motor 224 is fixed, so that the XY stage 105 is not moved in the y direction. Under the control of the stage control circuit 122, the rotation axis of the motor 222 is rotated by a predetermined rotation angle, so that the XY stage 105 is stepped and moved in the x direction by a predetermined movement amount. Every time the XY stage 105 performs the stepped movement, a laser beam for measurement is irradiated on the reflecting mirror 32 of the XY stage 105 from the laser length measurement device 126 of which arrangement position is fixed, the reflected beam from the reflecting mirror 32 is received, and the y-direction distance to the XY stage 105 is measured by the laser interference principle between the reflected beam and the reference beam. The laser length measurement device 126 measures (calculates) the y-direction position yj of the XY stage 105 at each position in the x direction by using each data of the y-direction distance. The measurement data of the measured y-direction position yj of the XY stage 105 is output to the y-direction position measurement unit 52. Alternatively, the laser length measurement device 126 may measure the y-direction distance at each position, and the y-direction position measurement unit 52 may measure (calculate) the y-direction position yj of the XY stage 105 at each of the positions in the x direction by using each data of the y-direction distance.

FIG. 7 is a diagram illustrating an example of a measurement interval in the first embodiment. As described above, the y-direction position yj of the XY stage 105 is measured at an interval equal to or smaller than the spot diameter. Therefore, the distance can be measured without a gap in the x direction with respect to the reflecting plane of the reflecting mirror 32. More preferably, as illustrated in FIG. 7, a value smaller than the spot diameter 40 is used as an interval equal to or smaller than the spot diameter. The measurement error caused by the mirror distortion can be reduced by overlapping portions of the measurement regions. More preferably, the measurement is performed at an interval of ½ or less of the spot diameter 40. The measurement error caused by the mirror distortion can be further reduced as the overlapping ratio of the measurement regions is larger.

As the y-direction variable x-direction position measurement step (S104), in a state that the movement of the XY stage 105 in the x direction (the second direction) is fixed, while moving the XY stage 105 in the y direction at an interval equal to or smaller than the spot diameter of the laser beam irradiated on the XY stage 105, the laser length measurement device 124 (the second laser length measurement device) measures the x-direction position of the XY stage 105 for each position moved by the laser interferometry technique using the laser beam. Specifically, under the control of the stage control circuit 122, the rotation axis of the motor 222 is fixed, so that the XY stage 105 is not moved in the x direction. Then, under the control of the stage control circuit 122, the rotation axis of the motor 224 is rotated by a predetermined rotation angle, so that the XY stage 105 is stepped and moved in the y direction by a predetermined movement amount. Every time the XY stage 105 performs the stepped movement, a laser for measurement is irradiated on the reflecting mirror 30 of the XY stage 105 from the laser length measurement device 124 of which arrangement position is fixed, the reflected beam from the reflecting mirror 30 is received, and the x-direction distance to the XY stage 105 is measured by the laser interference principle between the reflected beam and the reference beam. The laser length measurement device 124 measures (calculates) the x-direction position xi of the XY stage 105 at each position in the y direction by using each data of the x-direction distance. The measurement data of the measured x-direction position xi of the XY stage 105 is output to the x-direction position measurement unit 54. Alternatively, the laser length measurement device 124 may measure the x-direction distance at each position, and the x-direction position measurement unit 54 may measure (calculate) the x-direction position xi of the XY stage 105 at each of the positions in the y direction by using the data in the x-direction distance.

Even in the measurement of the x-direction position xi, as described above, the measurement is performed at an interval equal to or smaller than the spot diameter. More preferably, as illustrated in FIG. 7, a value smaller than the spot diameter 40 is used as an interval equal to or smaller than the spot diameter. More preferably, the measurement is performed at an interval of ½ or less of the spot diameter 40. Herein, the measurement may be performed at the same interval as the interval measured in the y direction position yj.

In the measurement of the x-direction position xi and the measurement of the y-direction position yj, it is preferable that the target object 101 is mounted on the XY stage 105. Thus, it can be measured including the influence of deflection or the like caused by a load of the target object 101. As the target object 101, in addition to a mask blank on which pattern-writing is to be performed, a mask substrate where a chromium (Cr) film not coated with a resist is formed may be employed. Alternatively, it may be a glass substrate on which a resist and a chromium (Cr) film are not formed.

In addition, it is preferable that the measurement of the x direction position xi and the measurement of the y direction position yj are performed several times, respectively. The measurement error can be reduced by using the average value of the measurement results obtained by a plurality of measurements.

The measurement of the x-direction position xi and the measurement of the y-direction position yj may be performed with respect to the range (FIG. 3) of the x-direction size L'x and the range (FIG. 3) of the y-direction size L'y of the maximum region where the center of the optical axis of the electron beam 200 is located within the pattern-writing region 10 of the target object 101 in a case where the target object 101 is mounted on the XY stage 105. Alternatively, the measurement may be performed with respect to the range (FIG. 3) of the x-direction size L'x and the range (FIG. 3) of the y-direction size L'y of the maximum region where the deflector 208 can deflect the electron beam 200 in the pattern-writing region 10 of the target object 101. Since the measurement range does not reach the entire reflecting mirrors 30 and 32, measurement time can be shortened. In addition, it is possible to reduce the amount of data.

FIGS. 8A and 8B are diagrams illustrating the measurement results in the first embodiment. It can be understood that, by the measurement described above, as illustrated in FIG. 8A, the x-direction position xi (=x1, x2, x3, x4, x5, . . . ) is obtained for each reflection position in a case where the same x-direction position is measured at each reflection position aligned in the y direction of the reflecting mirror 30 of the XY stage 105. Similarly, it can be understood that, as illustrated in FIG. 8B, the y-direction position yj (=y1, y2, y3, y4, y5, . . . ) is obtained for each reflection position in a case where the same y-direction position is measured at each reflection position aligned in the x direction of the reflecting mirror 32 of the XY stage 105.

As the x-direction variable y-direction distortion amount $\Delta y$ calculation step (S106), the y-direction distortion $\Delta y$ calculation unit 56 (first distortion amount calculation unit) calculates the distortion amount $\Delta yj$ of the position of the XY stage 105 in the y direction at each position in the x direction on the basis of the y-direction position yj of the XY stage 105 measured at each position in the x direction. More specifically, the difference value obtained by subtracting the y-direction design position as the reference from the y-direction position yj in measuring the y-direction position yj may be calculated as the distortion amount $\Delta yj$. It can be understood that, by such calculation, the distortion amount $\Delta yj$ (=$\Delta y1$, $\Delta y2$, $\Delta y3$, $\Delta y4$, $\Delta y5$, . . . ) is obtained at each reflection position aligned in the x direction of the reflecting mirror 32.

As the y-direction variable x-direction distortion amount $\Delta x$ calculation step (S108), the x-direction distortion $\Delta x$ calculation unit 58 (second distortion amount calculation unit) calculates the distortion amount $\Delta xi$ of the position of the XY stage 105 in the x direction at each position in the y direction on the basis of the x-direction position xi of the XY stage 105 measured at each position in the y direction. More specifically, the difference value obtained by subtracting the x-direction design position as the reference from the x-direction position xi in measuring the x-direction position xi may be calculated as the distortion amount $\Delta xi$. It can be understood that, by such calculation, the distortion amount $\Delta xi$ (=$\Delta x1$, $\Delta x2$, $\Delta x3$, $\Delta x4$, $\Delta x5$, . . . ) is obtained at each reflection position aligned in the y direction of the reflecting mirror 30.

As described above, in the first embodiment, since only one-dimensional data is obtained with respect to the distortion amount $\Delta xi$ and the distortion amount $\Delta yj$, it is possible to reduce the amount of data. Furthermore, since the measurement may be performed with respect to the range (FIG. 3) of the x-direction size L'x and the range (FIG. 3) of the y-direction size L'y of the maximum region located in the pattern-writing region 10 of the target object 101, it is possible to reduce the amount of data.

Figure 9:
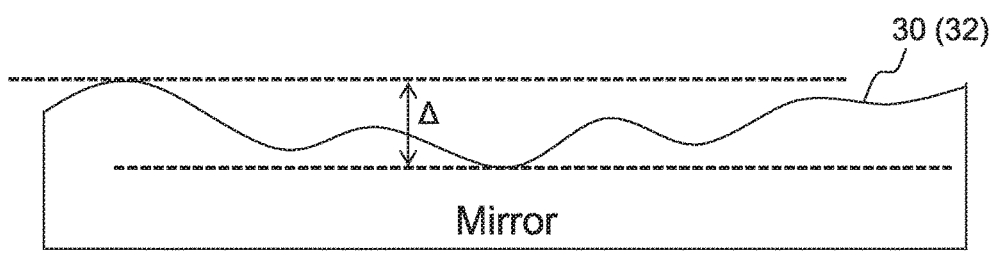
FIG. 9 is a diagram illustrating an example of mirror distortion in the first embodiment.

FIG. 9 is a diagram illustrating an example of the mirror distortion in the first embodiment. As illustrated in FIG. 9, the amplitude $\Delta$ of the minute distortion of the mirrors 30 and 32 is not necessarily uniform. Therefore, by measuring the x-direction position xi of the XY stage 105 at each position in the y direction and the y-direction position yj of the XY stage 105 at each position in the x direction, an accurate distortion amount can be obtained.

As the two-dimensional map generation step (S110), the two-dimensional map generation unit 60 generates a two-dimensional map ($\Delta xi$, $\Delta yj$) of the distortion amount of the position of the XY stage 105.

Figure 10:
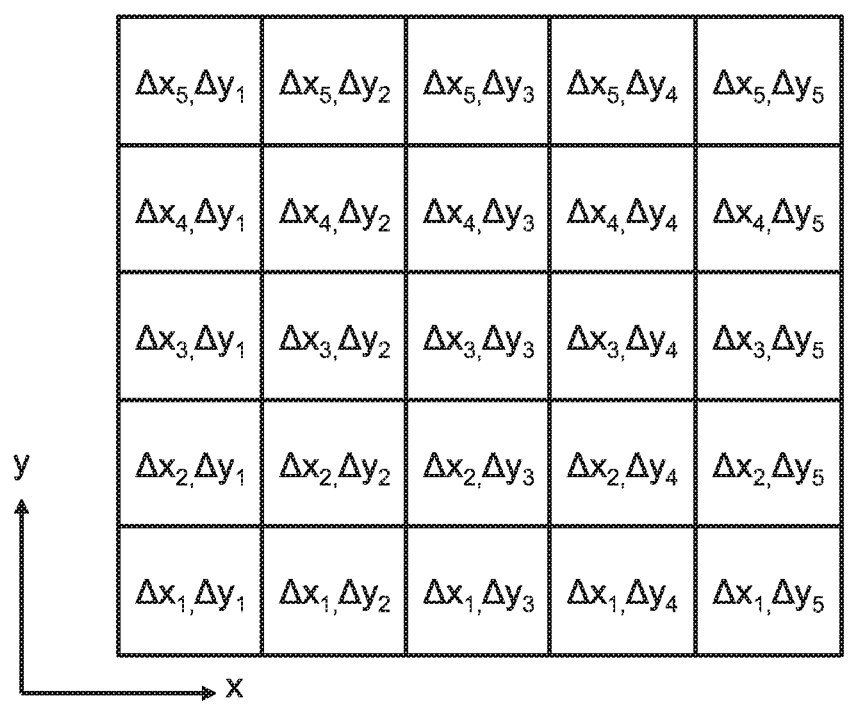
FIG. 10 is a diagram illustrating an example of a two-dimensional map in the first embodiment.

FIG. 10 is a diagram illustrating an example of the two-dimensional map in the first embodiment. The example of FIG. 10 illustrates a two-dimensional map in a case where, as a measurement point, the index i in the x-direction position is measured from 1 to 5 and the index j in the y-direction position is measured from 1 to 5. As illustrated in FIG. 10, in the two-dimensional map ($\Delta xi$, $\Delta yj$) in the first embodiment, as the distortion amount of the position of the XY stage 105 in the x direction at each position in the x direction at each position in the y direction, the distortion amount $\Delta yj$ measured at the position of the XY stage 105 in the y direction at each position in the x direction is applied. As the distortion amount of the position of the XY stage 105 in the x direction at each position in the y direction, the distortion amount $\Delta xi$ measured at the position of the XY stage 105 in the x direction at each position in the measured y-direction at each position in the x direction is applied. In other words, as illustrated in FIG. 10, in the two-dimensional map in the first embodiment, the index j increases in the x-axis direction. In addition, the index i increases in the y-axis direction. Then, the same distortion amount $\Delta yj$ is defined in each y-direction column aligned in the x axis direction. In addition, the same distortion amount $\Delta xi$ is defined in each x-direction column aligned in the y-axis direction. The two-dimensional map ($\Delta xi$, $\Delta yj$) generated as described above is stored in the storage device 142.

Figures 11A, 11B:
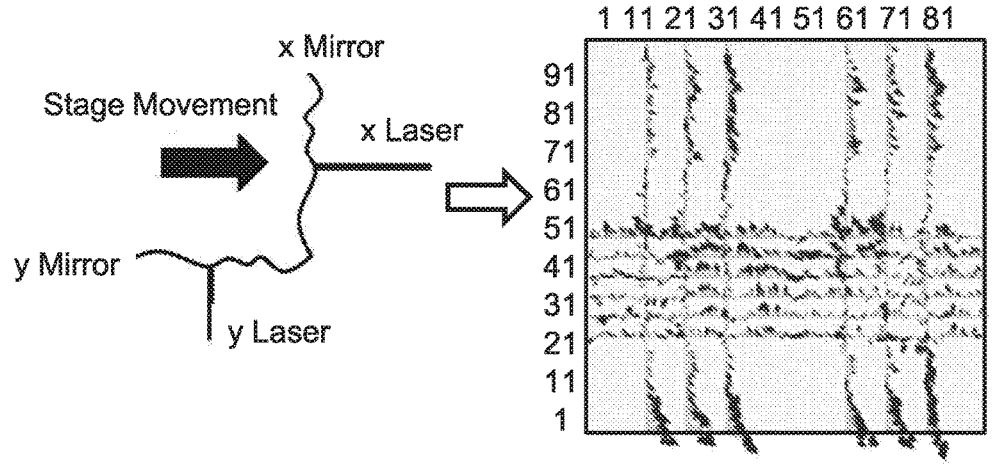
FIGS. 11A and 11B are diagrams illustrating the two-dimensional map in the first embodiment.

FIGS. 11A and 11B are diagrams illustrating the two-dimensional map in the first embodiment. As illustrated in FIG. 11A, by measuring the x-direction position xi and the y-direction position yj, the distortion amount $\Delta xi$ and the distortion amount $\Delta yj$ can be obtained. Then, as illustrated in FIG. 11B, a sequence of distortion amounts $\Delta xi$ varying in the y direction are arranged at respective positions in the x axis direction. Similarly, a sequence of distortion amounts $\Delta yj$ varying in the x direction is arranged at respective positions in the y axis direction. As a result, ($\Delta xi$, $\Delta yj$) at each intersection point becomes the distortion amount at that position.

As described above, it is possible to obtain the two-dimensional map ($\Delta xi$, $\Delta yj$) of the distortion amount at each position within the maximum region where the center of the optical axis of the electron beam 200 is located within the pattern-writing region 10 of the target object 101 in a case where the target object 101 is mounted on the XY stage 105. Since it is unnecessary to measure the entire reflecting mirrors 30 and 32, it is possible to reduce the amount of data.

As a shot data generation step (S112), the shot data generation unit 50 reads the pattern-writing data from the storage device 140 and performs a plurality of stages of data conversion processing to generate device specific shot data. A plurality of figures are defined in the pattern-writing data. However, in order to write a figure with the lithography apparatus 100, it is necessary to divide a figure defined in the pattern-writing data into patterns having a size that can be irradiated with a shot of one beam. Therefore, in order to actually write, the shot data generation unit 50 divides each figure into patterns having a size that can be irradiated with a shot of one beam to generate a shot figure. Then, shot data is generated for each shot figure. In the shot data, for example, figure data such as a figure type, a figure size, and a pattern-writing position (x, y) (irradiation position) are defined. In addition, the beam irradiation time according to the dose is defined. The shot data is sorted in shot order and defined. The generated shot data may be temporarily stored in the storage device 142. The deflection control circuit 130 reads out the generated shot data in shot order.

As the pattern coordinate correction step (S114), the correction unit 62 corrects position data indicating the position on the target object 101 mounted on the XY stage 105 by using the distortion amounts ($\Delta xi$, $\Delta yj$) defined in the two-dimensional map. In the first embodiment, the position data is corrected by correcting the coordinates of the pattern defined in the pattern-writing data for writing the pattern on the target object 101 by using the electron beam 200. For example, the coordinates of the pattern defined in the shot data stored in the storage device 142 are corrected. Alternatively, the coordinates of the figure defined in the pattern-writing data before generating the shot data may be corrected.

Figures 12, 13A, 13B:
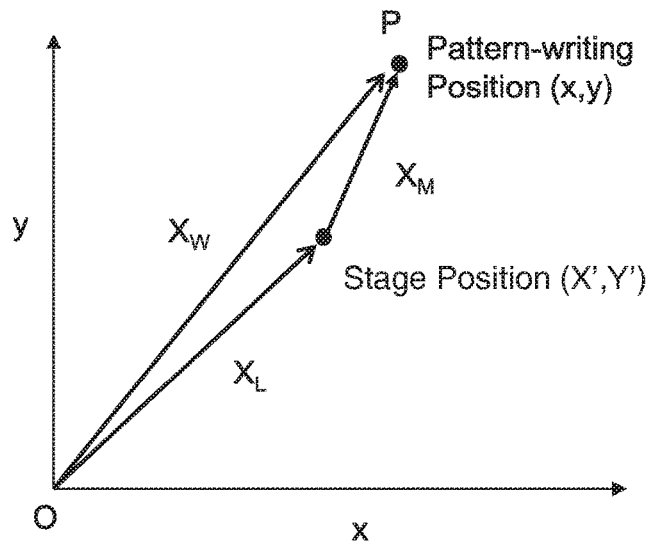
FIG. 12 is a diagram illustrating a relationship between a stage position and a pattern-writing position in the first embodiment.
FIGS. 13A and 13B are diagrams illustrating an example of a format of shot data in the first embodiment.

FIG. 12 is a diagram illustrating the relationship between the stage position and the pattern-writing position in the first embodiment. As illustrated in FIG. 12, a case where a pattern is written at the position of the point P in the device located at the origin O of the stage coordinate system will be considered. In the shot data (pattern data), a position $X_W$ (indicated by a vector) from the origin of the device is described as a position to be written. In actual writing, the beam is irradiated to the $X_W$ position by a combination of stage movement and deflection. For this reason, the stage is moved to the vicinity of the initially planned position $X_L$ (indicated by a vector). The stage position $X_L$ is measured by the laser length measurement devices 124 and 126. Then, the deflection control circuit 130 calculates a difference $X_M$ (indicated by a vector) between the pattern-writing positions $X_W$ and $X_L$ as follows.

$$X_M = X_W - X_L$$

Then, the difference $X_M$ is calculated as the deflection amount, and the electron beam 200 is irradiated.

However, the distortion errors ($\Delta xi$, $\Delta yj$) are included in the stage position $X_L$ measured by the laser length measurement devices 124 and 126 caused by the distortion of the reflecting mirrors 30 and 32. Therefore, in the first embodiment, the correction is performed by adding the correction amount ($-\Delta xi$, $-\Delta yj$) for correcting such distortion error ($\Delta xi$, $\Delta yj$) to the position $X_W$ (indicated by a vector) from the origin of the pattern defined in the shot data (pattern data)

FIGS. 13A and 13B are diagrams illustrating an example of a format of the shot data in the first embodiment. FIG. 13A illustrates a format of the shot data before correcting the distortion error of the stage position caused by the mirror distortion. In the shot data, for example, figure data such as a figure type (figure code) k, coordinates (x, y) (irradiation position), and a figure size (Lx, Ly) are defined. By correcting the distortion error, the coordinates (x, y) are corrected into the coordinates (x$-\Delta xi$, y$-\Delta yj$) as illustrated in FIG. 13B. The indices i and j in such a case indicate the spot position of the laser beam on the reflecting mirrors 30 and 32 when measuring the position of the XY stage 105 in a case where the shot figure is written. Since the pattern-writing position $X_W$ is limited within the deflectable range of the deflector 208 from the position $X_L$ of the XY stage 105, if the two-dimensional map corresponding to the pattern-writing region 10 of the target object 101 is generated, it is possible to obtain data for correction with respect to each pattern-writing position $X_W$. The stage position $X_L$ in the case of writing each shot figure may be planned in advance by the pattern-writing control unit 64. The corrected shot data is stored in the storage device 142.

As the pattern-writing step (S116), the pattern-writing mechanism 150 writes a pattern on the target object 101 on the basis of the corrected position data by using the electron beam 200. First, the deflection control circuit 130 inputs the position (X', Y') of the XY stage 105 measured by the laser length measurement devices 124 and 126 and calculates the deflection amount for irradiating the electron beam to the pattern-writing position (x−Δxi, y−Δyj) for each shot figure by using the position (X', Y') of the XY stage 105.

The pattern-writing mechanism 150 deflects the electron beam 200 on the basis of the obtained deflection amount and writes a predetermined pattern. Specifically, the following operations are performed. The deflection control circuit 130 outputs, for example, a digital signal indicating the calculated deflection amount to the deflector 208. Then, the digital signal is analog-converted and amplified by the DAC amplifier 132 and is applied as a deflection voltage to the deflector 208. The operations of the pattern-writing mechanism 150 are as follows.

The electron beam 200 emitted from the electron gun assembly 201 illuminates the entire first aperture plate 203 having a rectangular hole by the illumination lens 202. Herein, the electron beam 200 is first shaped to have a shape of a rectangle. Then, the electron beam 200 of the first aperture plate image having passed through the first aperture plate 203 is projected onto the second aperture plate 206 by the projection lens 204. The position of the first aperture plate image on the second aperture plate 206 is subjected to deflection control by the deflector 205, so that the beam shape and size can be changed (variably shaped). In general, for each shot, the beam shape and size are often changed. In addition, there are cases where beams having the same beam shape and size are shot consecutively. Then, the electron beam 200 of the second aperture plate image having passed through the second aperture plate 206 is focused by the objective lens 207, deflected by the deflector 208 controlled by the deflection control circuit 130, and irradiated to a desired position of the target object 101 on the continuously moving XY stage 105 driven by the motors 222 and 224 controlled by the stage control circuit 122.

As described above, according to the first embodiment, it is possible to correct the position of the stage mechanism with respect to the minute distortion of the mirrors 30 and 32 of the stage mechanism. Therefore, even in the case of reducing the spot diameter on the mirror plane of the laser beam irradiated from the laser length measurement devices 124 and 126 to the XY stage 105, the pattern can be written at a highly accurate position.

In a case where the target object 101 is mounted deviating from the design position set on the XY stage 105, the deviation amount of the target object 101 can be grasped by scanning the alignment marks prepared in advance on the target object 101. If the deviation amount of the target object 101 can be grasped, the pattern-writing control unit 64 can also write a pattern at a position obtained by adding the deviation amount. In such a case, in the two-dimensional map of the distortion amount in the first embodiment, data corresponding to the pattern-writing region 10 of the target object 101 is defined on the assumption that the target object is placed at the initial design position. Therefore, if the mounted position of the target object 101 is deviated, the electron beam 200 may be irradiated to the position of the XY stage 105 which is not defined in the two-dimensional map of the distortion amount. In such a case, assuming that the distortion occurring at the end of the pattern-writing region 10 is repeated, the correction may be performed by utilizing the data at the end portion of the pattern-writing region 10.

Second Embodiment

In the first embodiment, the case of correcting the measurement error of the stage position occurring in a case where the spot diameter on the mirror plane of the laser beam irradiated from the laser length measurement devices 124 and 126 to the XY stage 105 becomes small has been described. The method of correcting the position of the stage mechanism with respect to the minute distortion of the mirrors 30 and 32 of the stage mechanism is not limited thereto. In the second embodiment, the configuration of the position correction performed by variably adjusting the spot diameter d on the mirror plane of the laser beam irradiated from the laser length measurement devices 124 and 126 to the XY stage 105 will be described. Hereinafter, contents other than those specifically described are the same as those in the first embodiment.

Figure 14:
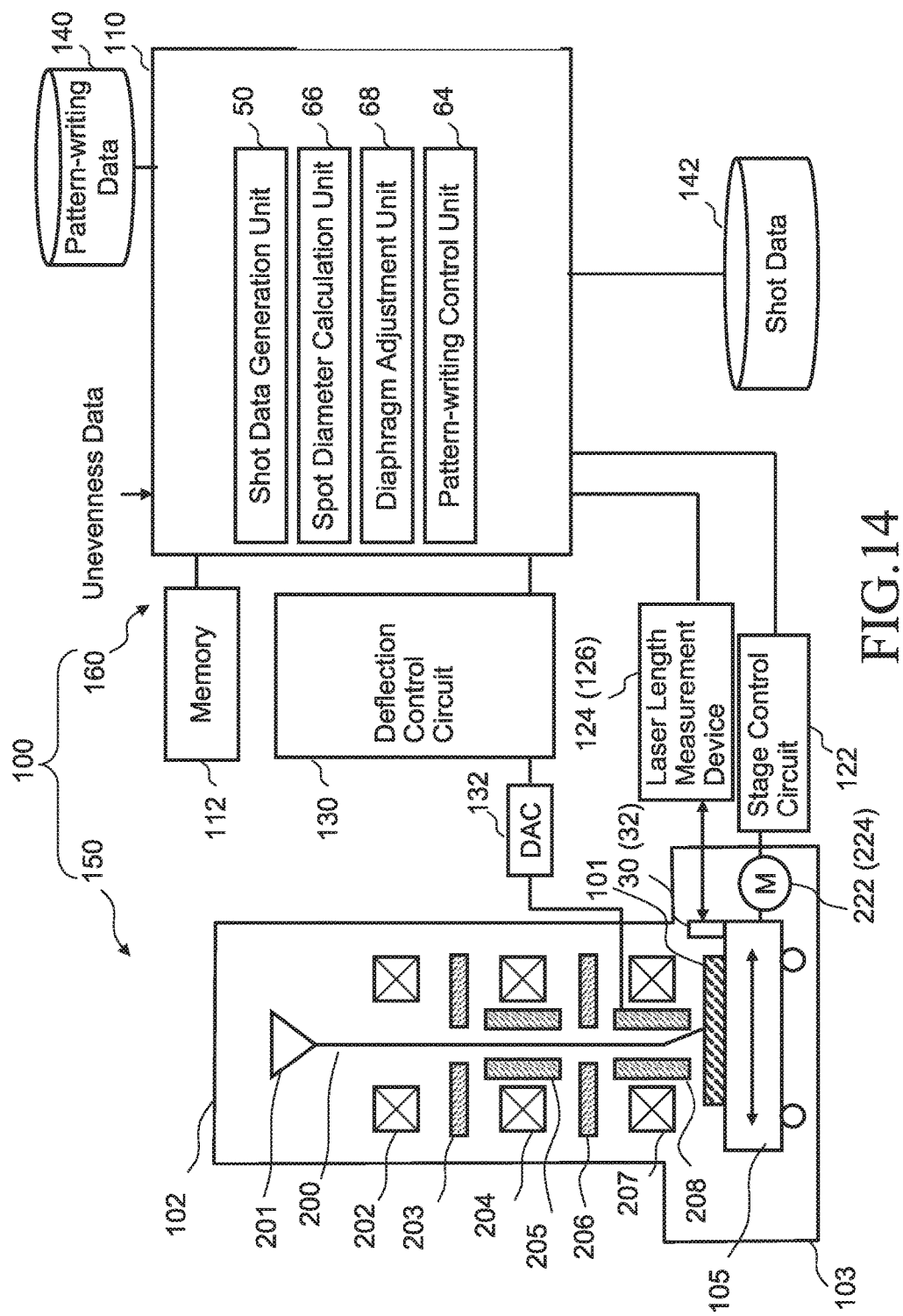
FIG. 14 is a conceptual diagram illustrating a configuration of a lithography apparatus according to the second embodiment.

FIG. 14 is a conceptual diagram illustrating a configuration of the lithography apparatus according to the second embodiment. FIG. 14 is the same as FIG. 1 except that a spot diameter calculation unit 66 and a diaphragm adjustment unit 68 are arranged in the control computer 110, instead of the y-direction position measurement unit 52, the x-direction position measurement unit 54, the y-direction distortion Δy calculation unit 56, the x-direction distortion Δx calculation unit 58, the two-dimensional map generation unit 60, and the correction unit 62.

Each of the " . . . units" such as the shot data generation unit 50, the pattern-writing control unit 64, the spot diameter calculation unit 66, and the diaphragm adjustment unit 68 includes a processing circuitry. As the processing circuitry, for example, an electric circuit, computer, processor, circuit board, quantum circuit, or semiconductor device can be used. Each " . . . unit" may use a common processing circuitry (same processing circuitry), or different processing circuitries (separate processing circuitries). The input data necessary for or the calculation results of the shot data generation unit 50, the pattern-writing control unit 64, the spot diameter calculation unit 66, and the diaphragm adjustment unit 68 are stored in the memory 112 each time.

Figure 15:
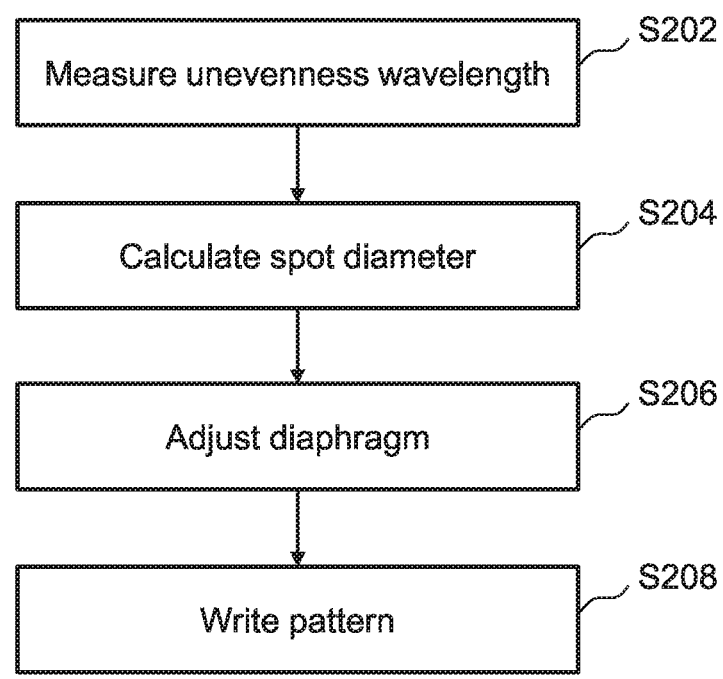
FIG. 15 is a flowchart illustrating main steps of a lithography method according to the second embodiment.

FIG. 15 is a flowchart illustrating main steps of lithography method according to the second embodiment. In FIG. 15, in the lithography method according to the second embodiment, a series of steps of an uneven shape wavelength measurement step (S202), a spot diameter calculation step (S204), a diaphragm adjustment step (S206), and a pattern-writing step (S208) are performed.

As the uneven shape wavelength measurement step (S202), measured is a wavelength of an uneven shape of the reflecting plane (first plane) of the reflecting mirror 30 of the XY stage 105 extending in the y direction (the first direction) and being irradiated with the laser beam for measuring the position of the XY stage 105 on which the target object 101 is mounted by the laser interferometry technique and a wavelength of an uneven shape of the reflecting plane (second plane) of the reflecting mirror 32 of the XY stage 105 extending in the x direction (second direction) perpendicular to the y-direction. Specifically, the uneven shapes of the reflecting planes of the reflecting mirrors 30 and 32 are measured, respectively, by using a shape measurement device. For example, a laser displacement meter, a confocal type displacement meter, a capacitive type measurement device, a heterodyne interferometer, or the like may be appropriately used as the shape measurement device. The wavelength λ of the uneven shape distortion is calculated from the measured uneven shape data of the reflecting mirrors 30 and 32. The uneven shape data including the wavelength λ data of the uneven shape distortion obtained is input to the lithography apparatus 100 and stored in the storage device 142. The measurement of the uneven shapes of the reflecting planes of the reflecting mirrors 30 and 32 is preferably performed in a state of being attached to the XY stage 105, but the measurement may be performed in a state of being detached.

As the spot diameter calculation step (S204), the spot diameter calculation unit 66 calculates the spot diameter d of the laser beam so that the spot diameter d of the laser beam is equal to or larger than the wavelength of the uneven shape of the reflecting mirror 30 measured and the wavelength of the uneven shape of the reflecting mirror 32 measured. The spot diameter d on the reflecting plane of the reflecting mirror 30 may be different from the spot diameter d on the reflecting plane of the reflecting mirror 32. In such a case, the spot diameter calculation unit 66 calculates the spot diameter d of the laser beam for the reflecting mirror 30 and the spot diameter d of the laser beam for the reflecting mirror 32. In a case where the uneven shape data does not include the wavelength data, the spot diameter calculation unit 66 may calculate the wavelength λ of the uneven shape distortion from the uneven shape data. In a case where the wavelength differs depending on the position, the maximum value may be calculated. Even with respect to the maximum value, herein, the wavelength of the minute distortion exceeding the processing technique, for example, less than the order of several mm may be calculated.

As the diaphragm adjustment step (S206), the diaphragm adjustment unit 68 adjusts the light flux diameter of the laser beam so that the spot diameter of the laser beam is equal to or larger than the measured uneven shape wavelength of the reflecting mirrors 30,32. In such the case that the spot diameter d on the reflecting plane of the reflecting mirror 30 may be different from the spot diameter d on the reflecting plane of the reflecting mirror 32, the diaphragm adjustment unit 68 adjusts the light flux diameter of the laser beam so that the spot diameter of the laser beam is equal to or larger than the measured uneven shape wavelength of the reflecting mirrors 30 and adjusts the light flux diameter of the laser beam so that the spot diameter of the laser beam is equal to or larger than the measured uneven shape wavelength of the reflecting mirrors 32.

Figure 16:
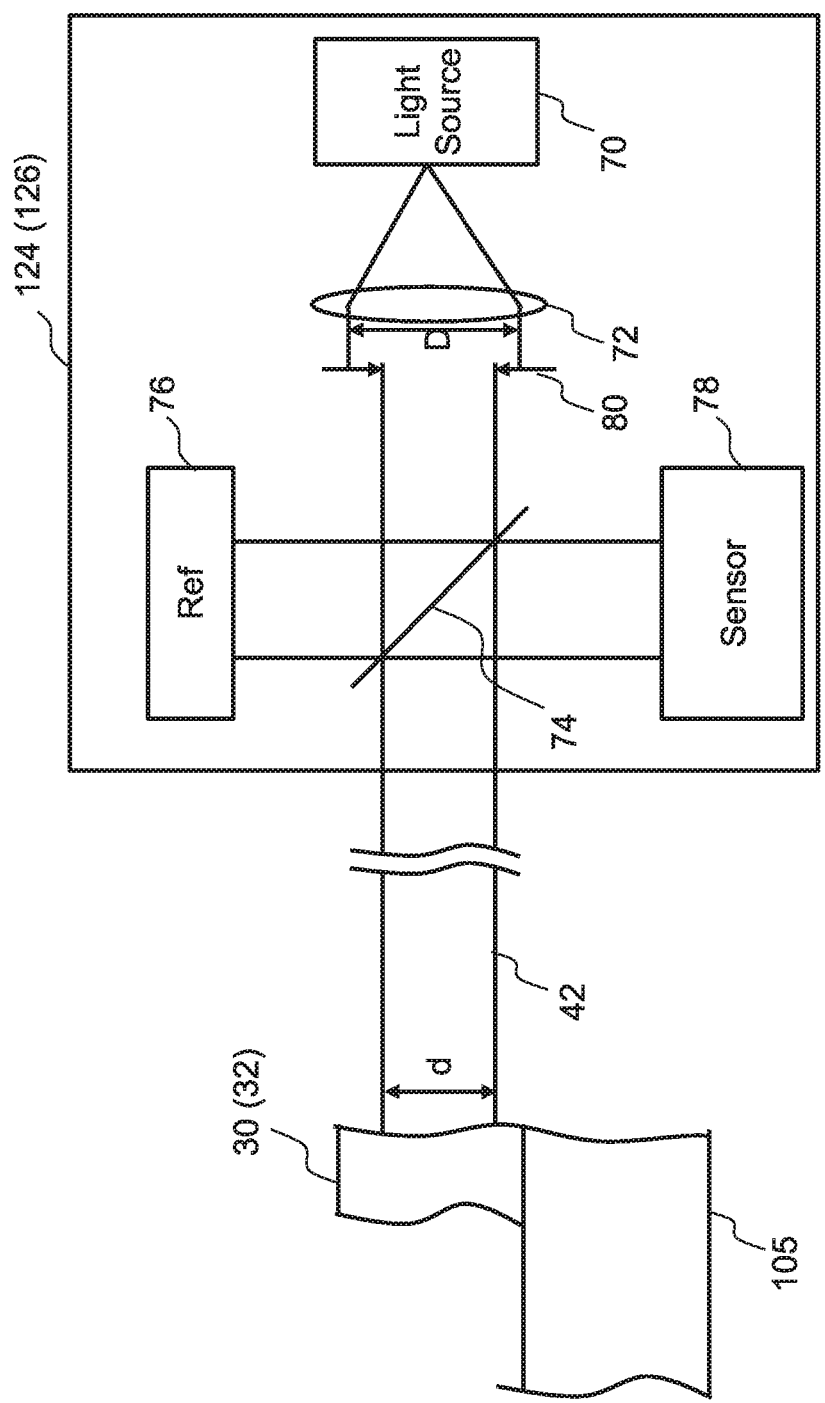
FIG. 16 is a diagram illustrating an example of a configuration of the laser length measurement device in the second embodiment.
Figure 17:
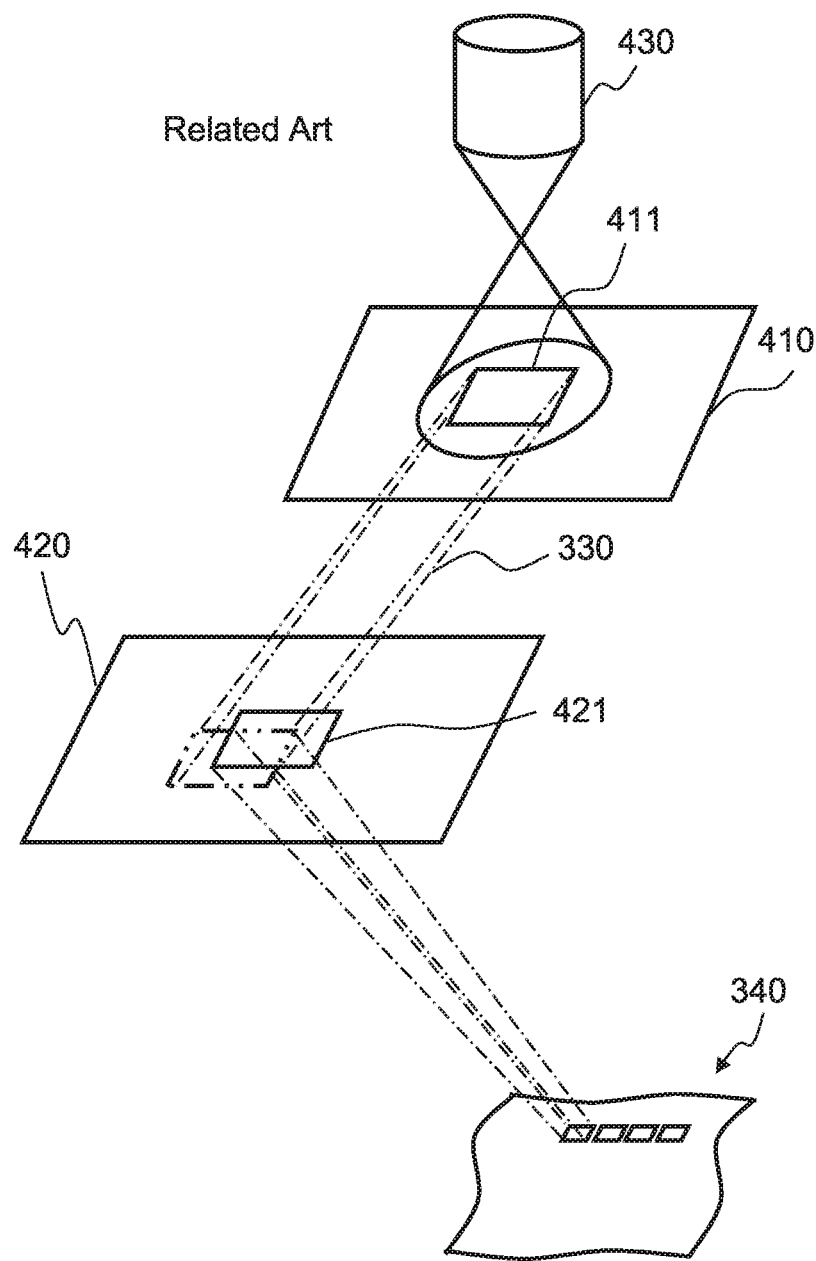
FIG. 17 is a conceptual diagram illustrating operations of a variable-shaped electron beam lithography apparatus.

FIG. 16 is a diagram illustrating an example of the configuration of the laser length measurement device in the second embodiment. In FIG. 16, in the laser length measurement devices 124 and 126 in the second embodiment, the laser beam generated from the light source 70 is bent by the lens 72 into parallel light (light flux diameter D) and is irradiated to the beam splitter 74. A portion (for example, ½) 42 of the laser beam irradiated to the beam splitter 74 passes through the beam splitter and is irradiated to the reflecting plane of the reflecting mirror 30 (32) of the XY stage 105. In addition, the remaining portion (for example, ½) of the laser beam is reflected and irradiated to the reflecting plane of the reference reflection plate 76. The reflected beam from the reflecting plane of the reflecting mirror 30 (32) is reflected by the beam splitter 74 and is irradiated on the sensor 78. The reflected beam from the reflecting plane of the reference reflection plate 76 passes through the beam splitter 74 and is irradiated on the sensor 78. In the sensor 78, the distance to the reflecting mirror 30 (32) is measured by the interference principle using the two reflected beams.

In such a case, the diaphragm adjustment unit 68 outputs a control signal of the spot diameter d of the laser beam to the laser length measurement devices 124 and 126. In the laser length measurement devices 124 and 126, the light flux diameter of the beam is adjusted by controlling the opening diameter of the diaphragm according to the control signal so that the spot diameter on the reflecting plane of the reflecting mirror 30 (32) becomes the calculated spot diameter d. In the example of FIG. 16, a case where the parallel light is irradiated to the reflecting mirror 30 (32) from the laser length measurement devices 124 and 126, but the present invention is not limited thereto. Even in a case where the light is not parallel light, the spot diameter on the reflecting plane of the reflecting mirror 30 (32) may be adjusted.

By controlling the spot diameter d on the reflecting plane of the reflecting mirror 30 (32) to be equal to or larger than the measured uneven shape wavelength of the reflecting mirrors 30,32, the uneven shape error can be averaged. Therefore, it is possible to correct the position of the XY stage 105 with respect to the minute distortion of the mirror 30 (32) of the XY stage 105. As mentioned above, the spot diameter d on the reflecting plane of the reflecting mirror 30 may be different from the spot diameter d on the reflecting plane of the reflecting mirror 32. The spot diameter d on the reflecting plane of the reflecting mirror 30 is controlled to be equal to or larger than the measured uneven shape wavelength of the reflecting mirrors 30, and the spot diameter d on the reflecting plane of the reflecting mirror 32 is controlled to be equal to or larger than the measured uneven shape wavelength of the reflecting mirrors 32.

As the pattern-writing step (S208), the position of the XY stage 105 is measured by a laser interferometry technique using a laser beam of which light flux diameter is adjusted so that the spot diameter is equal to or larger than the uneven shape wavelength. Then, on the basis of the measured position of the XY stage 105, the pattern-writing mechanism 150 writes a pattern on the target object 101 using the electron beam 200.

In the second embodiment, the spot diameter of the laser beam irradiated on the reflecting plane of the reflecting mirror 30 (32) from the laser length measurement devices 124 and 126 is not narrowed down, but the spot diameter is controlled so as to be equal to or larger than the measured uneven shape wavelength. As a result, since the maximum value and the minimum value of the amplitude Δ of the distortion are included within the spot diameter d, the measurement error of the position of the XY stage 105 caused by the distortion can be suppressed to a negligible degree due to the averaging effect. Therefore, it is possible to eliminate the need to correct the coordinates and the like of the pattern-writing data (shot data).

Heretofore, the embodiment has been described with reference to specific examples. However, the present invention is not limited to these specific examples. In the examples described above, the case of applying to the lithography apparatus 100 using a single beam has been described. However, even in the case of applying to a lithography apparatus using multiple beams, the coordinates of a figure to be written may be corrected according to the distortion amount.

In addition, descriptions of components such as device configurations and control methods which are not directly necessary for explanation of the present invention are omitted, but necessary device configurations and control methods can be appropriately selected and used. For example, although the description of the configuration of the control unit that controls the lithography apparatus 100 is omitted, a necessary configuration of the control unit is appropriately selected and used.

In addition, all the stage mechanism position correction methods and charged particle beam lithography apparatuses which have elements of the present invention and can be appropriately designed and changed by those skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of correcting a position of a stage mechanism, comprising:
   measuring a first direction position of a stage by a laser interferometry technique using a first laser beam to be irradiated to the stage for each position moved by moving the stage in a second direction perpendicular to the first direction at an interval equal to or smaller than a spot diameter of the first laser beam in a state that movement of the stage in the first direction is fixed;
   measuring a second direction position of the stage by the laser interferometry technique using a second laser beam to be irradiated to the stage for each position moved by moving the stage in the first direction at an interval equal to or smaller than a spot diameter of the second laser beam in a state that movement of the stage in the second direction is fixed;
   calculating a distortion amount of a position in the first direction of the stage at each position in the second direction based on the first direction position of the stage measured at each position in the second direction;
   calculating a distortion amount of a position in the second direction of the stage at each position in the first direction based on the second direction position of the stage measured at each position in the first direction;
   generating a two-dimensional map of the distortion amount at the position of the stage by applying the distortion amount of the position in the first direction of the stage at each of the measured positions in the second direction as the distortion amount of the position in the first direction of the stage at each position in the second direction at each position in the first direction and by applying the distortion amount of the position in the second direction of the stage at each of the measured positions in the first direction as the distortion amount of the position in the second direction of the stage at each position in the first direction at each position in the second direction; and
   correcting position data indicating a position of a target object mounted on the stage by using the distortion amount defined in the two-dimensional map,
   wherein the spot diameter of the first laser beam and the spot diameter of the second beam are equal to or smaller than ½ of a wavelength of distortion of a position measurement plane of the stage.

2. The method according to claim 1, wherein a value smaller than the spot diameter is used as the interval equal to or smaller than the spot diameter.

3. The method according to claim 1, wherein the position data is corrected by correcting coordinates of a pattern defined in pattern-writing data for writing a pattern on the target object by using a charged particle beam.

4. The method according to claim 1, wherein the measurement of the first direction position of the stage at each position in the second direction is performed in a state that the target object is mounted on the stage.

5. The method according to claim 4, wherein the measurement of the second direction position of the stage at each position in the first direction is performed in a state that the target object is mounted on the stage.

6. A charged particle beam lithography apparatus comprising:
   a first laser length measurement device configured to measure a first direction position of a stage by a laser interferometry technique using a laser beam to be irradiated to the stage for each of positions at an interval smaller than a spot diameter of the first laser beam in a second direction intersecting the first direction by moving the stage in the second direction;
   a second laser length measurement device configured to measure a second direction position of the stage by the laser interferometry technique using the laser beam to be irradiated to the stage for each of positions at an interval smaller than a spot diameter of the second laser beam in the first direction by moving the stage in the first direction;
   a first distortion amount calculation processing circuit configured to calculate a first distortion amount of a position in the first direction of the stage at each of the positions in the second direction based on the first direction position of the stage measured;
   a second distortion amount calculation processing circuit configured to calculate a second distortion amount of a position in the second direction of the stage at each of the positions in the first direction based on the second direction position of the stage measured;
   a two-dimensional map generation processing circuit configured to generate a two-dimensional map of distortion amount based on the first distortion amount at each of the positions in the second direction and the second distortion amount at each of the positions in the first direction;
   a correction processing circuit configured to correct position data indicating a position of a target object on the stage by using the two-dimensional map; and
   a pattern-writing mechanism including the stage, an emission source emitting a charged particle beam, and a deflector deflecting the charged particle beam to write a pattern on the target object based on the corrected position data by using the charged particle beam.

7. The apparatus according to claim 6, wherein the first laser length measurement device is configured to measure the first direction position of the stage for each of positions at an interval of ½ or less of the spot diameter of the first laser beam, and the second laser length measurement device is configured to measure the second direction position of the stage for each of positions at an interval of ½ or less of the spot diameter of the second laser beam.

8. The apparatus according to claim 6, wherein the correction processing circuit is configured to correct the position data by correcting coordinates of a pattern defined in pattern-writing data for writing a pattern on the target object by using a charged particle beam.

9. The method according to claim 6, wherein the spot diameter of the first laser beam and the spot diameter of the second beam are equal to or smaller than ½ of a wavelength of distortion of a position measurement plane of the stage.

10. The method according to claim 6, wherein the first laser length measurement device is configured to measure the first direction position of the stage in a state that a target object is mounted on the stage.

11. The method according to claim 10, wherein the second laser length measurement device is configured to measure the second direction position of the stage in a state that the target object is mounted on the stage.

12. The method according to claim 11, wherein the first and second laser length measurement devices are configured to measure the first and second direction positions of the stage, respectively, only within a region where a center of an optical axis of an electron beam to be irradiated to the target object is located within a pattern-writing region of the target object.

13. The method according to claim 11, wherein the first and second laser length measurement devices are configured to measure the first and second direction positions of the stage, respectively, only within a region where a deflector can deflect an electron beam in a pattern-writing region of the target object.

14. A method of correcting a position of a stage mechanism, comprising:
   measuring a first direction position of a stage by a laser interferometry technique using a first laser beam to be irradiated to the stage for each of positions at an interval smaller than a spot diameter of the first laser beam in a second direction intersecting the first direction by moving the stage in the second direction;
   measuring a second direction position of the stage by the laser interferometry technique using a second laser beam to be irradiated to the stage for each of positions at an interval smaller than a spot diameter of the second laser beam in the first direction by moving the stage in the first direction;
   calculating a first distortion amount of a position in the first direction of the stage at each of the positions in the second direction based on the first direction position of the stage measured;
   calculating a second distortion amount of a position in the second direction of the stage at each of the positions in the first direction based on the second direction position of the stage measured;
   generating a two-dimensional map of distortion amount based on the first distortion amount at each of the positions in the second direction and the second distortion amount at each of the positions in the first direction; and
   correcting position data indicating a position of a target object on the stage by using the two-dimensional map.

15. The method according to claim 14, wherein the measurement of the first direction position of the stage is performed for each of positions at an interval of ½ or less of the spot diameter of the first laser beam, and the measurement of the second direction position of the stage is performed for each of positions at an interval of ½ or less of the spot diameter of the second laser beam.

16. The method according to claim 14, wherein the position data is corrected by correcting coordinates of a pattern defined in pattern-writing data for writing a pattern on the target object by using a charged particle beam.

17. The method according to claim 14, wherein the spot diameter is equal to or smaller than ½ of a wavelength of distortion of a position measurement plane of the stage.

18. The method according to claim 14, wherein the measurement of the first direction position of the stage at each position in the second direction is performed in a state that a target object is mounted on the stage.

19. The method according to claim 18, wherein the measurement of the second direction position of the stage at each position in the first direction is performed in a state that the target object is mounted on the stage.

20. The method according to claim 19, wherein the measurement of the first direction position of the stage and the measurement of the second direction position of the stage are performed only within a region where a center of an optical axis of an electron beam to be irradiated to the target object is located within a pattern-writing region of the target object.

21. The method according to claim 19, wherein the measurement of the first direction position of the stage and the measurement of the second direction position of the stage are performed only within a region where a deflector can deflect an electron beam in a pattern-writing region of the target object.

* * * * *